United States Patent [19]
Norton et al.

[11] Patent Number: 5,790,416
[45] Date of Patent: Aug. 4, 1998

[54] UPDATING HIERARCHICAL DAG REPRESENTATIONS THROUGH A BOTTOM UP METHOD

[75] Inventors: Joseph Wayne Norton; David Theodore Blaauw; Larry Grant Jones, all of Austin, Tex.

[73] Assignee: Motorola, Inc., Schaumburg, Ill.

[21] Appl. No.: 529,772

[22] Filed: Sep. 18, 1995

[51] Int. Cl.$^6$ .............................. H01L 21/70; H01L 23/50
[52] U.S. Cl. .......................................... 364/490; 364/488
[58] Field of Search .................................. 364/488, 489, 364/490, 491, 224; 395/500, 601

[56] References Cited

U.S. PATENT DOCUMENTS

| | | | |
|---|---|---|---|
| 5,347,652 | 9/1994 | Epstein et al. | 395/601 |
| 5,481,473 | 1/1996 | Kim et al. | 364/490 |
| 5,497,334 | 3/1996 | Russell et al. | 364/489 |

OTHER PUBLICATIONS

Larry G. Jones, "Fast Batch and Incremental Netlist Compilation of Hierarchical Schematics", IEEE Transactions On Computer-Aided Design, vol. 10, No.7, Jul. 1991, pp. 922–931.

Larry G. Jones, "Efficient Evaluation of Circular Attribute Grammars", ACM Transactions on Programming Languages & Sys., vol. 12, No.3, Jul. 1990, pp. 429–462.

Larry G. Jones, "Fast Incremental Netlist Compilation of Hierarchical Schematics", 1989 IEEE, pp. 326–329.

Larry G. Jones, "Fast Onling/Offline Netlist Compilation of Hierarchical Schematics", 26th ACM/IEEE Design Automation Conference/1989, Paper 45.6, pp. 822–825.

Larry G. Jones, "Hierarchical VLSI Design Systems Based on Attribute Grammars", 1986—13th Annual ACM Symposium on Principles of Programming Languages, pp. 58–69.

Larry G. Jones, "Incremental Online Netlist Compilation of Hierarchical Schematics", Rpt. #UIUCDCS-R-89-1487, 1988 Nat'l. Science Foundation, pp. 1–11.

Larry G. Jones, Dissertation; "Increment VLSI Design Systems Based On Circular Attribute Grammars", 1986 Pennsylvania State University Microfilms Int'l., pp. 1–107.

*Primary Examiner*—Kevin J. Teska
*Assistant Examiner*—Dan Fiul

[57] ABSTRACT

A process and implementing computer system (13) for updating circuit representations in a hierarchical Directed Acyclic Graph (DAG) format (400–410) based upon changes made to the primitive components of the circuit in a flat representation (201–213) includes performing a depth first search (505) on the hierarchical representation of the circuit beginning at the root level (501) for a given path. At each lower level, each child instance is visited (505) and if there is any change in any attribute between the hierarchical and flat representations (509), the component in the hierarchical representation which needs to be changed is copied (807) and connected to the children components of the original hierarchical representation. Changes in the attributes of the children components are made in the copied component (809). If the new component already exists in the hierarchy 811, then that component is deleted (817), otherwise the copied component is returned (813), and changes are passed upwardly to the root level (815) where the previous DAG may be replaced with the copied and updated DAG which includes changes in the attributes of components of a corresponding flat circuit representation.

20 Claims, 4 Drawing Sheets

UPDATING HIERARCHICAL DAG REPRESENTATIONS THROUGH A BOTTOM UP METHOD

REFERENCE TO RELATED APPLICATION

The present application is related to the following U.S. patent applications:

"Element Sizing for Integrated Circuits", invented by David T. Blaauw et al., having Ser. No. 08/495,061, filed Jun. 26, 1995, and assigned to the assignee hereof; and "Power Optimization For Integrated Circuits", invented by Timothy J. Edwards et al., having Ser. No. 08/521,493, filed Aug. 30, 1995, and assigned to the assignee hereof.

FIELD OF THE INVENTION

The present invention relates generally to integrated circuit design and more particularly to a method and apparatus for modifying computerized hierarchical circuit representations of integrated circuits.

BACKGROUND OF THE INVENTION

With the increasing demand for integrated circuits to drive electronic devices of all kinds, there is an even greater need for an accurate and flexible method of maintaining drawing accuracy and integrity for the circuit representations of the drawings describing the electrical interconnections between and among components, devices and sub-systems of such integrated circuits. In general, all electronic devices include at least one integrated circuit ("IC") or "chip" which may integrate millions of transistors and connections on one tiny substrate of semiconductor material. The miniaturization of integrated circuits, and the products which they control, continues to be of major significance in the marketplace and a driving force to the manufacturers of such products.

Since integrated circuits may contain millions of transistors and connections, the design of such integrated circuits and the management and maintenance of the drawings associated with such circuits, representing millions of components and connections, have required the use of various computer-related methods and implementations. Such methods not only store the electrical connections and components of ICs, but they also provide a relatively easy way for updating such drawings when changes to the drawings are made as a result of, for example, field engineering or product design changes, added functionality or upgrades to the IC. Such technical drawing management and maintenance methods may be implemented in hardware but are generally in the form of computer-aided design (CAD) software programs which are operated, for example, from a personal computer or a computer workstation.

In a CAD tool environment, it is often necessary to maintain two different representations of a particular circuit. A "hierarchical" representation contains layers of abstractions that are used to build sub-systems of a circuit's design, while a "flat" circuit representation is composed of only the "primitives" or individual components, i.e. individual transistors, resistors, etc., of the circuit.

In a hierarchical representation, the layers of abstractions, such as logic gates and functional block representations, hide implementation details, promote re-use and help simplify a circuit's representation. The lowest level of a hierarchical circuit description contains the set of circuit primitives (i.e. transistors in the case of VLSI design), used to implement the design.

Methods already exist for extracting a flat "netlist" of circuit modules and interconnecting nodes from a hierarchical circuit description. Such methods insure that "top down" modifications made to a circuit's hierarchical description are propagated properly to the circuit's flat representation, i.e. the flat representation is kept consistent with changes to the hierarchical representation.

With the aid of CAD programs running on high powered computers, IC designers are now able to optimize various parameters and characteristics of integrated circuits including the size and power requirements of individual components in integrated circuits. Since those changes are made to the individual components or "primitives" of an IC, such changes must be incorporated into the set of drawings or representations of the IC being modified or optimized. However, as discussed above, although there exist methods for reflecting hierarchical changes to drawings from the "top down" to the so called "flat" representation including individual components, there exists a need for a method and apparatus for accommodating changes from a flat representation to its corresponding hierarchical Directed Acyclic Graph or DAG representation i.e. from the "bottom up". Although methods exist which incorporate changes from a flat netlist of modules to a hierarchical circuit description, such methods have been applied only to hierarchical circuits in a tree representation and not in a "DAG" representation.

BRIEF DESCRIPTION OF THE DRAWINGS

A better understanding of the present invention can be obtained when the following detailed description of a preferred embodiment is considered in conjunction with the following drawings, in which.

DESCRIPTION OF THE PREFERRED EMBODIMENT

A hierarchical circuit representation is typically composed of "components" "instances" "nets" and "wires". A "component" is a basic building block that contains a collection of "nets", "wires" and "instances" of so-called "child" components. An "instance" is an occurrence of a component. A component may occur any number of times as an instance within any number of "parent" components. An instance of a component (e.g. nMOS or pMOS components) typically has "attributes" e.g. transistor length and width. A "net" is an electrical connection point within a component and a "wire" is an electrical connection between a parent component's net and a net inside an instance of a "child" component. A "path" refers to a list of instances that correspond to a complete or partial traversal from the root instance of a Directed Acyclical Graph (DAG) to a leaf instance.

A flat circuit representation or netlist, is composed of "modules" and "nodes". A "module" is a primitive construct used when implementing an actual circuit design, e.g. nMOS and pMOS transistors. A "primitive construct" also has attributes including transistor length and width. An electrical "node" is used to connect a circuit's modules and a netlist is a collection of modules interconnected by electrical nodes.

Every module in a flat representation corresponds to a unique traversal or path of a design's Directed Acyclical Graph or "DAG". A unique traversal is represented as an ordered list of instances beginning with a "root" instance of the design DAG, and ending with a "leaf" instance, e.g. a pMOS or nMOS transistor.

A design's flat and hierarchical representations are considered consistent if every module's attributes in the flat representation are equal to their corresponding leaf instance's attributes in the hierarchical representation. A hierarchical design's flat representation may or may not have modules with attributes which differ from corresponding attributes in the hierarchy. The disclosed method is effective to equalize corresponding attributes when such attribute differences exist.

The method disclosed is a recursive procedure that operates on a design's DAG in a "depth-first-search" (DFS) manner in the present example. The method assumes the existence of a design DAG for the circuit as well as a corresponding flat description for the circuit. Methods for creating a DAG and a corresponding description for a circuit are well known in the art of integrated circuit design.

Figure 5:
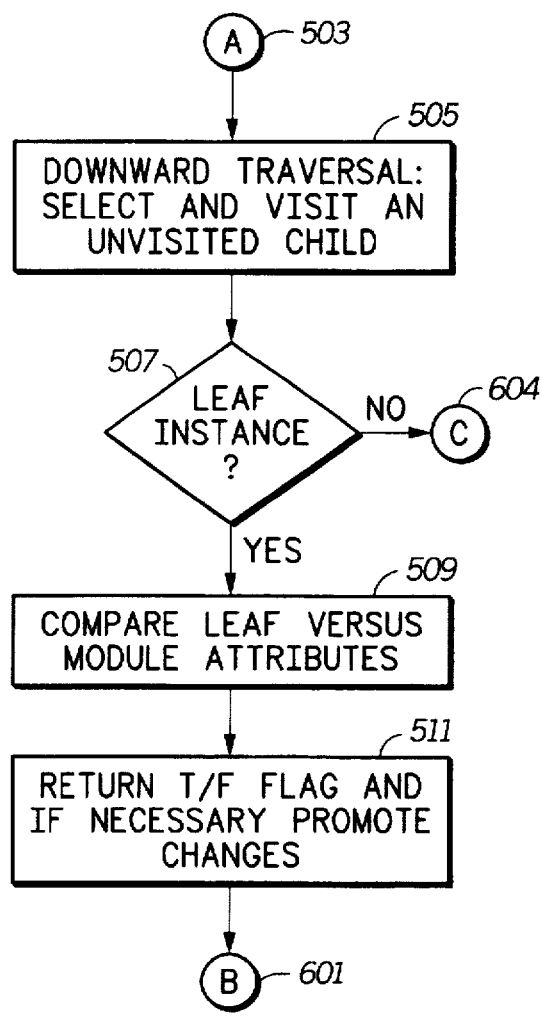
FIG. 5 is a flow diagram illustrating a portion of one embodiment of a method in accordance with the present invention.

Referring to FIG. 5, the method begins with a call to the recursive procedure and the design DAG's root instance as an argument. That initial procedure call starts the downward DFS traversal of the design DAG. During the downward traversal of the DFS, for "non-leaf instances" (i.e. an instance not at the lowest level of the structure), the updating method of the present invention simply recurs on the sub-component instances of the current instance's component until the "current" instance is confirmed to be a "leaf" instance. When a leaf instance is detected, e.g. a pMOS or nMOS transistor, the method stops the downward traversal, and compares the attributes of the particular leaf instance against the attributes of the leaf's corresponding module in the flat representation of the particular circuit undergoing the updating process.

If there is a difference between the attributes, i.e. if the gate width, for example, of a transistor has been sized-up in order to speed-up an integrated circuit under consideration, but the hierarchical representation of the circuit which includes the transistor has not yet been updated and shows a smaller sized transistor, then that difference is detected and a "TRUE" flag is returned to indicate that at least one attribute of the particular component under current analysis is not consistent in both the flat representation and the hierarchical representation of the circuit being updated. If the attributes are identical in both drawing representations, then a "FALSE" flag is set. After either a "TRUE" or a "FALSE" flag has been set, the method returns one level in the upward traversal of the DAG hierarchical representation and continues the search and update process (e.g. see step 603 in FIG. 6).

Figure 6:
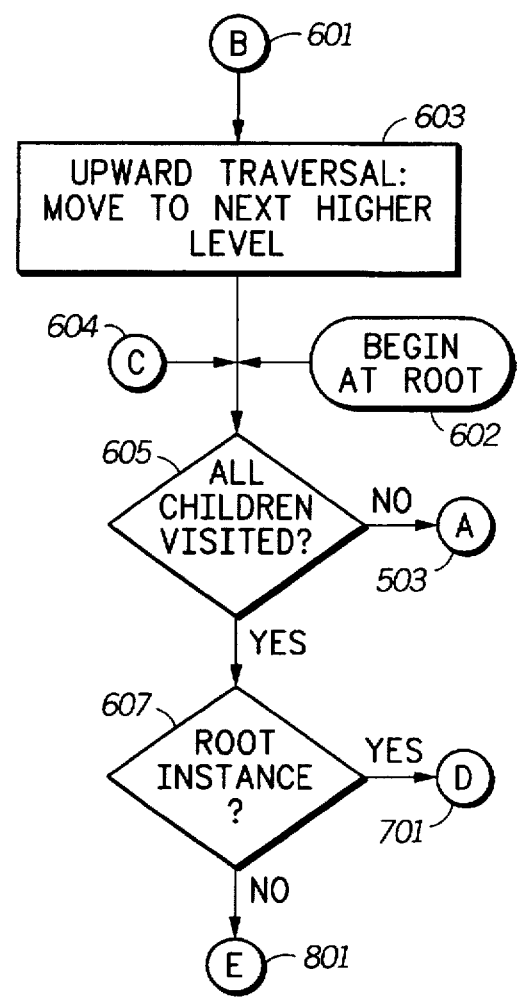
FIG. 6 is a flow diagram illustrating another portion of the illustrated exemplary embodiment of the present invention.

Referring to FIG. 6, during the upward traversal of the DFS, there is a complete (downward and upward) traversal of all of the child instances i.e. component occurrences, for all parent elements. The set of returned flags is then checked for root and non-root instances to determine each flag status, which in turn, determines which instances in the hierarchical representation need to have their attributes changed in order to be consistent with the attributes of corresponding modules in the flat circuit representation. For non-root instances, if all flags are "FALSE", a "FALSE" flag is returned for that component (see e.g. step 805 in FIG. 8) and the upward traversal is continued. For non-root instances, if any flag is "TRUE", a copy of the current instance's component is made (see e.g. step 807 in FIG. 8) and then the copied component is modified to reflect changes found in the complete traversal of the component's child instances. Depending upon the type of the child's instance, the changes may either come from the flat representation for leaf instances, or from the newly created components in the hierarchical DAG for non-leaf instances. After any indicated changes are made, a "TRUE" flag is returned for the new component and the upward traversal is continued (see step 815 in FIG. 8). When a root instance is detected (see step 607 in FIG. 6), the root instance is replaced with an instance of the component returned from the complete traversal of the root's original component (see step 709 in FIG. 7). As explained, the present method describes how changes made to a module's (e.g. transistor's) length and width in a design's flat representation can be updated into the design's hierarchical representation. The method is not limited, however, to the two attributes of length and width, but is easily applied also to other types of circuit primitive attributes. For example, a circuit design could also specify physical layout attributes such as the number of layout foldings for each transistor.

Figure 1:
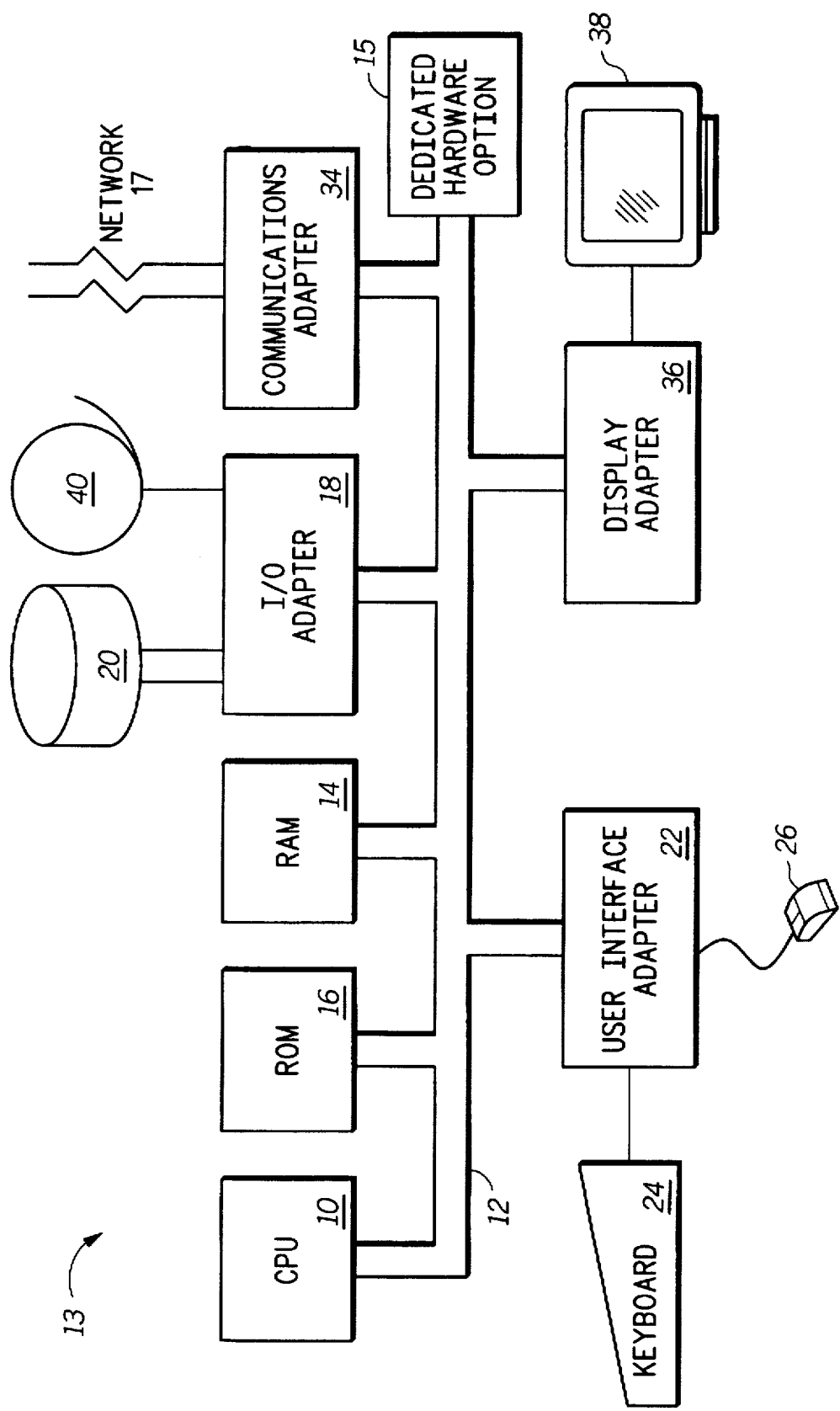
FIG. 1 is a block diagram of an electronic system within which one embodiment of the present invention may be implemented.

The various methods discussed may be implemented within dedicated hardware 15, or with processes implemented within a data processing system 13 as shown in FIG. 1. A typical hardware configuration of a workstation in accordance with the present invention is illustrated and includes a central processing unit (CPU)10, such as a conventional microprocessor, and a number of other units interconnected via system bus 12. The workstation shown in FIG. 1 includes random access memory (RAM) 14, read only memory (ROM) 16, and input/output (I/O) adapter 18 for connecting peripheral devices, such as disk units 20 and tape units 40, to bus 12. A user interface adapter 22 is used to connect a keyboard device 24 and a mouse 26 to the system bus 12. Other user interface devices such as a touch screen device (not shown) may also be coupled to the system bus 12 through the user interface adapter 22.

A communication adapter 34 is also shown for connecting the workstation to a data processing network 17. Further, a display adapter 36 connects the system bus 12 to a display device 38. The method of the present invention may be implemented and stored in one or more of the disk units 20, tape drives 40, ROM 16 and/or RAM 14, or even made available to system 13 via a network connection through communications adapter 34 and thereafter processed by CPU 10. Since the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 2:
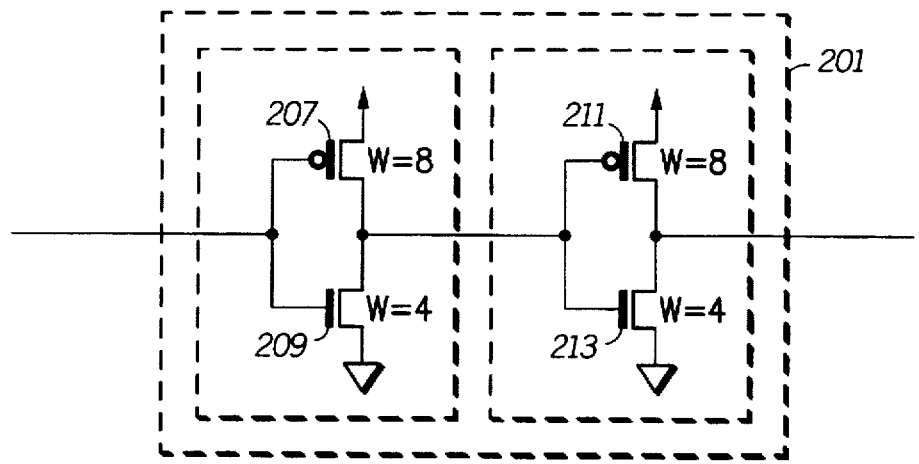
FIG. 2 is a schematic diagram of a buffer circuit.

In FIG. 2, there is illustrated a buffer circuit 201 in a flat schematic representation. The buffer 201 is comprised of two inverter circuits 203 and 205 connected in series between buffer input and output lines. Inverter 203 has an input line connected to the gate terminals of a p-type metal oxide silicon field effect transistor (pMOS-FET or pMOS) 207 and an n-type MOS-FET 209. Transistors 207 and 209 are connected in series and arranged for connection between appropriate voltage levels. As shown, pMOS 207 has a gate width of 8 design units and nMOS 209 has a gate width of 4 design units. The midpoint between the outputs of transistors 207 and 209 is connected to a common point connecting the gate terminals of pMOS 211 and nMOS 213. Transistors 211 and 213 are also connected in series between appropriate voltage levels, and the midpoint between the outputs of transistors 211 and 213 provides an output from the inverter 205 which is also the output from the buffer 201. Transistor 211 is shown with a gate width of 8 design units and transistor 213 is shown with a gate width of 4 design units.

Figure 3:
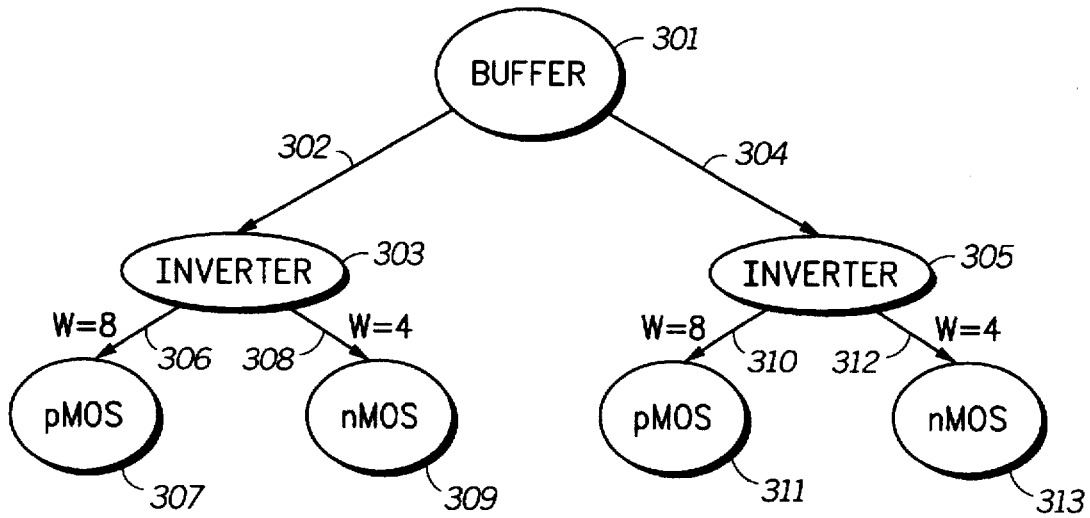
FIG. 3 is a hierarchical tree representation of the circuit shown in FIG. 2.

FIG. 3 shows a hierarchical tree representation of the schematic circuit shown in FIG. 2. The representation shown in FIG. 3 is referred to as "hierarchical" because it represents the circuit in different levels of abstraction in ascending and/or descending order rather than in the schematic form showing electrical components and electrical connections therebetween. The hierarchical representation of FIG. 3 is typical of all hierarchical representations in that it may be referred to as having a "root instance", e.g. buffer 301, since the buffer 301 appears as a root from which branches to components comprising the buffer extend. The hierarchical representation of FIG. 3 shows the buffer 301 being associated with inverters 303 and 305 which include the buffer 301, by lines 302 and 304. Inverters 303 and 305 in the hierarchical representation of FIG. 3 correspond to buffers 203 and 205 as shown in FIG. 2. Similarly, inverter 303 is shown associated with a pMOS transistor 307 and an nMOS transistor 309 by lines 306 and 308, respectively. Transistors 307 and 309, in the hierarchical FIG. 3, having gate widths of 8 design units and 4 design units, respectively, correspond to transistors 207 and 209 of the FIG. 2 flat representation. A design unit is a generic unit of measurement and may be assigned a specific value at some stage in the design process as may be desired. Inverter 305 is shown associated with pMOS transistor 311 and nMOS transistor 313 by lines 310 and 312, respectively. Transistors 311 and 313, in the hierarchical FIG. 3, having gate widths of 8 design units and 4 design units, respectively, correspond to transistors 211 and 213, respectively, in the flat schematic of FIG. 2. In the hierarchical representation of FIG. 3, the pMOS devices 307 and 311, and the nMOS devices 309 and 313, are referred to as "leaf instances" in the hierarchical terminology. Using other hierarchical terminology, buffer 301 is said to be the "parent" of its "children", which are the inverters 303 and 305. Similarly, inverter 303 is a "parent" of its "children" pMOS 307 and nMOS 309, while inverter 305 is a "parent" for its "children" which are pMOS instance 311 and nMOS instance 313.

Figure 4:
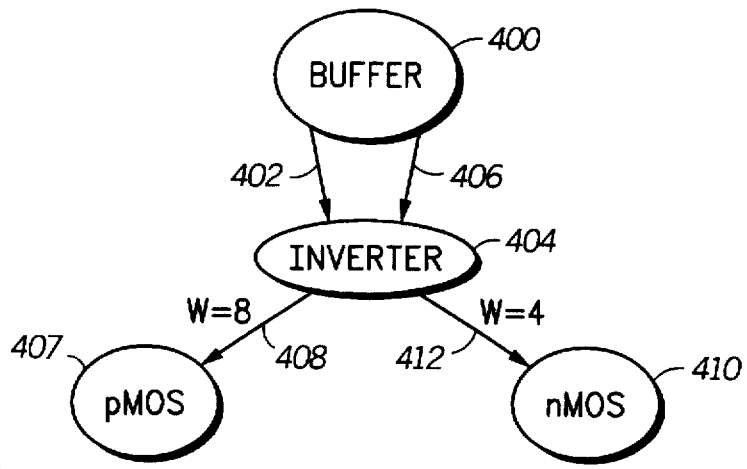
FIG. 4 is a hierarchical directed acyclical graph of the circuit shown in FIG. 2.

FIG. 4 shows a Directed Acyclical Graph (DAG) of the circuit shown in FIG. 2 and illustrated in the tree hierarchical representation of FIG. 3. The DAG is another form of hierarchical representation which contains the same circuit description information as the other representations but requires less storage or memory and does not illustrate duplicative or cyclic symbology. For example, FIG. 4 shows only one inverter symbol, one pMOS device symbol and one nMOS device symbol, and carries the number of children devices at any level as a separate element of the particular instance. In FIG. 4, a buffer 400 has two associations or lines 402 and 406 to an inverter level device 404. Inverter 404 has lines 408 and 412 to pMOS level device 407 and nMOS level device 410, respectively. The information that there are two inverter devices and four pMOS and nMOS devices is associated with the instances for each abstraction level device. For the sake of simplicity, FIGS. 3 and 4 are shown without the nets and wires that would normally be included to describe the electrical connectivity. The representation shown in FIG. 4 would show two different "INVERTER" symbols if, for example, the inverters 203 and 205 were not duplicates, i.e. if the size of the gate width for pMOS 207 were changed from a value of "8" as shown, to a value of "16". In that example, the inverter 205 would still have a pMOS device "(W=8)" and an nMOS "(W=4)" associated to the inverter, and a new 2nd inverter symbol would be used (not shown in FIG. 4) which would have a pMOS "(W=16)" and an nMOS "(W=4)" associated therewith.

FIG. 5 through FIG. 8 illustrate a flow chart of the method disclosed for updating hierarchical circuit representations. Considering FIGS. 5 and 6, the method begins at a root level 602 and if all children at that point have not been visited 605, then the method proceeds 503 in its downward traversal 505 as shown in FIG. 5. In FIG. 5, the method proceeds in a downward traversal 505 of the DAG with a "Depth First Search" (DFS) and makes a determination at each level whether the current point being considered in the DAG at any particular point in time is a leaf instance 507 i.e. at the lowest level of the DAG. If the particular DAG point is not a leaf level, the downward traversal proceeds 604 to determine if all children have been visited 605. If not, the method recurs 503 until a leaf instance is attained. At that point, the attributes of the leaf level component in the DAG circuit representation are compared to its corresponding component in the flat circuit representation 509. If there are differences between corresponding component attributes, then a "TRUE" flag is returned or set and the changes are promoted 511 to the next higher level. A difference would occur, for example, in a situation where a component in the flat representation has been increased in size or gate width in order to speed-up the component's IC or chip. In order to update that gate width or transistor size increase into the DAG representation of the circuit from the flat representation of the circuit, the disclosed method is utilized.

Figure 7:
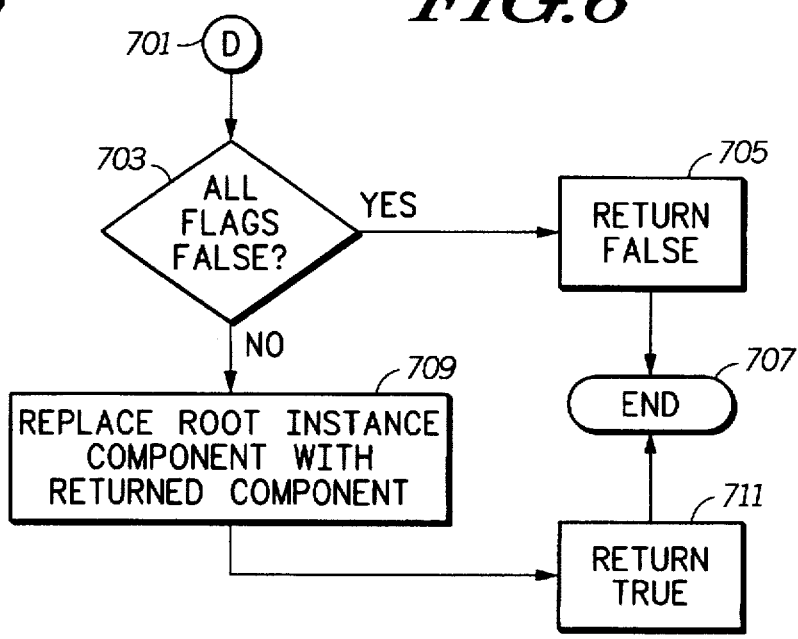
FIG. 7 is a flow diagram illustrating another portion of the illustrated exemplary embodiment of the present invention.
Figure 8:
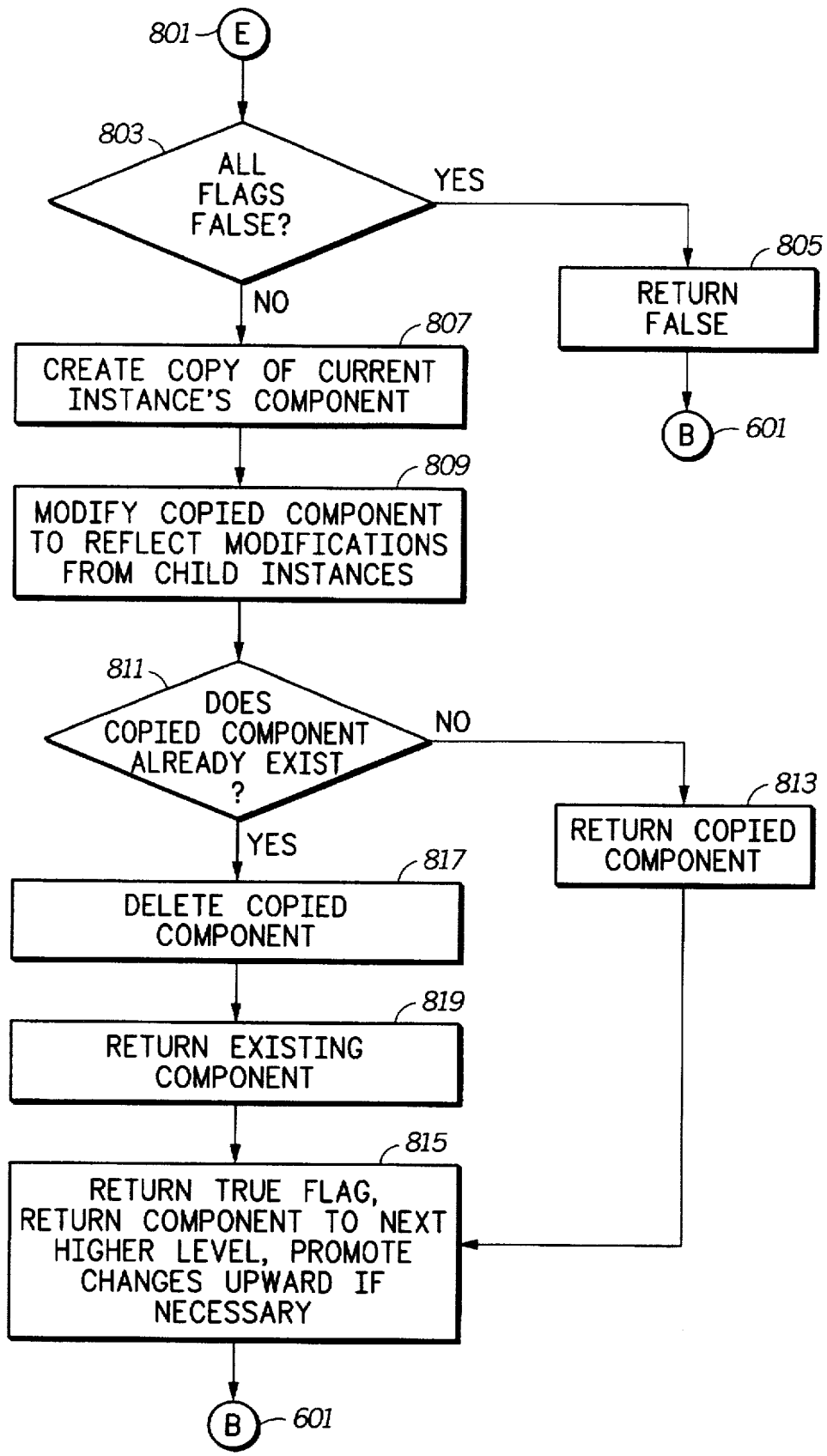
FIG. 8 is a flow diagram illustrating another portion of the illustrated exemplary embodiment of the present invention.

After returning the flag 511, the process moves upwardly 601 from the leaf instance e.g. the pMOS/nMOS level, to the next higher level 603, e.g. the inverter level. At that point, the process determines whether all children components of the presently considered component have been visited 605. If all children components have not been visited, the process returns 503 to the downward traversal 505 to repeat the process described above. After all children components of a given component have been visited, the process determines whether or not it is at a root instance 607. If the process is at a root instance, it is continued at point 701 as shown in FIG. 7, and if the process is not at a root instance, the process continues at point 801 as shown in FIG. 8.

If the last instance considered is determined to be a root instance 607, the process continues 701 to determine if all flags are "FALSE" 703. If all flags are "FALSE", meaning that there are no differences between attributes of corresponding components in flat and hierarchical representations, then a "FALSE" is returned 705 and the process will END 707, having successfully completed the hierarchical updating process. If, however, after determining that the instance being considered is at the root level 607, and also that all flags are not "FALSE" 703, then the root instance component is replaced with the returned component 709, a "TRUE" is returned 711, and the process will END 707.

When the instance being considered is not at the root level 607, a determination is made as to whether all flags are false 803. If all flags are determined to be "FALSE", a "FALSE" flag is returned 805 and the process continues 601 its upward traversal 603. If, however, it is determined that all flags are not "FALSE", a copy of the current instance's component is created 807. Next, the copy is modified to reflect the returned modifications from that instance's child instances 809. Next, a determination is made as to whether or not the copied component already exists 811, and if it does not, then the process returns a "TRUE" flag 815, returns the component to the next higher level 815 and promotes the changes upwardly if necessary 815, and returns 601 to the upward traversal 603 of the DAG. If, however, the copied component does exist 811, then the copied component is deleted 817 and the existing component is returned 819. At that time, a "TRUE" flag is returned, the component is returned to the next higher level and changes are promoted upwardly if necessary 815. The process then returns 601 to its upward traversal loop 603.

The method described herein may be implemented with dedicated hardware 15 or equivalently implemented in software residing, for example, in the RAM 14, CPU 10, ROM 16 or external storage devices such as the disk units 20 and/or tape units 40, or on a diskette or other portable storage device. When implemented in software, an exemplary listing of pseudocode to accomplish the method and functions described above is illustrated below. The "UPDATE" is a recursive procedure which is initiated at a given instance point, typically the root instance of the design DAG.

```
Update
    if component is leaf component then
        if attributes in hierarchical are not equal to
        attributes in flat then
            pass component and promote attribute
            changes to parent
        endif
    else
        copy=make copy of component
        for each instance i in schematic of component,
        where j is the equivalent instance in copy to i
        in original, do
            visit child instance by calling Update
            process with instance i added to path replace component j in copy with component
            passed from Update process if necessary, update attributes of j with
            changes from update process and promote any
            attribute changes to instance
        enddo
        if copy already exists in DAG then
            delete copy
            pass component to parent
        else
            pass copy to parent
        endif
    endif
```

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A method for updating a hierarchical directed acyclic graph (DAG) representation to reflect changes made to a corresponding flat representation as implemented on a computer, said method comprising the steps of:

determining a first value of a predetermined attribute in a modified flat representation, the modified flat representation resulting from changes to the corresponding flat representation;

performing a search to a predetermined level element in the hierarchical DAG representation;

determining whether a corresponding attribute of said predetermined level element has a value different from the first value of the predetermined attribute in the modified flat representation;

creating an updated hierarchical element, including said first value, for said predetermined level element in said hierarchical DAG representation; and storing information associated with the updated hierarchical element for said predetermined level element in a computer readable medium.

2. The method as set forth in claim 1 wherein said predetermined level element is a leaf level element.

3. The method as set forth in claim 2 wherein said hierarchical DAG representation is of an electrical circuit, said predetermined level element comprising an electrical component.

4. The method as set forth in claim 3 wherein after said step of creating said updated hierarchical element, said method further includes a step of creating an updated hierarchical circuit representation to include said updated hierarchical element.

5. The method as set forth in claim 3 wherein said method is repeated for each leaf level element in said hierarchical DAG representation of said electrical circuit.

6. The method as set forth in claim 4 wherein said method is repeated for each leaf level element in said hierarchical DAG representation.

7. The method as set forth in claim 3 wherein said step of creating said updated hierarchical element further includes a step of creating a copy of said leaf level element which exhibits said first value, said copy of said leaf level element being modified to include said first value.

8. The method as set forth in claim 7 wherein after said step of creating said updated hierarchical element, said method further includes a step of creating an updated hierarchical circuit representation to include said copy of said leaf level element.

9. The method as set forth in claim 7 wherein said method is repeated for each leaf level element in said hierarchical DAG representation.

10. The method as set forth in claim 3 wherein said method is initiated at a root level element.

11. The method as set forth in claim 3 wherein said leaf level element is a transistor.

12. The method as set forth in claim 11 wherein said predetermined attribute is a measure of delay of said transistor.

13. The method as set forth in claim 12 wherein said measure of delay is transistor gate width.

14. A storage medium including machine readable indicia, said storage medium being selectively coupled to a reading device, said reading device being coupled to processing circuitry, said reading device being selectively operable to read said machine readable indicia and provide program signals representative thereof, said program signals being effective to cause said processing circuitry to update a hierarchical directed acyclic graph (DAG) representation to reflect changes made to a corresponding flat representation, by performing the steps of:

performing a search to a predetermined level element in the hierarchical DAG representation;

determining whether a predetermined attribute of said predetermined level element has a value different from a changed value of a corresponding attribute of a corresponding element in the corresponding flat representation after the changes made to the corresponding flat representation; and creating an updated hierarchical element, including said changed value, for said predetermined level element in said hierarchical DAG representation.

15. A method for updating a hierarchical directed acyclic graph (DAG) representation of a circuit design as implemented on a computer, the hierarchical representation corresponding to a first flat representation, the hierarchical representation including a first element having a first attribute, the first attribute having a first value defined in the hierarchical representation, the method comprising the steps of:

determining a second value of the first attribute of the first element in a second flat representation, wherein the second flat representation is a modification of the first flat representation;

comparing the second value of the second flat representation to the first value of the hierarchical representation;

modifying the hierarchical representation consistent with the second flat representation, including modifying the first attribute of the first element to the second value of the second flat representation; and storing information associated with the hierarchical representation in a computer readable medium.

16. A method as in claim 15, further comprising the step of:

modifying the first flat representation to generate the second flat representation based on at least one change to the first flat representation.

17. A method as in claim 16, wherein the at least one change to the first flat representation implements a timing change for the circuit design.

18. A method for updating a hierarchical directed acyclic graph (DAG) representation of a circuit design as implemented on a computer, the method comprising the steps of:

initiating a computer program to update the hierarchical representation;

reading a first hierarchical design file, the first hierarchical design file defining the hierarchical representation of the circuit design, the first hierarchical design file being stored on a computer readable medium;

reading a first flat design file, the first flat design file being consistent with the first hierarchical design file, the first flat design file defining a first flat representation of the circuit design consistent with the hierarchical representation of the circuit design, the first flat design file being stored on a computer readable medium;

reading a second flat design file, the second flat design file being a modification of the first flat design file, the second flat design file being stored on a computer readable medium, the second flat design file defining a modified flat representation of the circuit design different from the first flat representation and not consistent with the hierarchical representation; and updating the hierarchical design file according to the second flat design file such that an updated hierarchical representation is consistent with the modified flat representation.

19. A method as in claim 18, wherein the step of reading the first hierarchical design file comprises the step of:

searching to a predetermined level in the hierarchical representation.

20. A method as in claim 18, further comprising the step of:

modifying the first flat representation to alter the timing of the design circuit.

\* \* \* \* \*